(12) United States Patent
Tominaga

(10) Patent No.: US 6,387,751 B2
(45) Date of Patent: May 14, 2002

(54) METHOD OF MANUFACTURING SEMICONDUCTOR DEVICE HAVING HIGH-DENSITY CAPACITOR ELEMENTS

(75) Inventor: Atsushi Tominaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/901,072

(22) Filed: Jul. 10, 2001

Related U.S. Application Data

(62) Division of application No. 09/228,982, filed on Jan. 12, 1999, now Pat. No. 6,278,172.

(30) Foreign Application Priority Data

Jun. 15, 1998 (JP) ............................................ 10-166574

(51) Int. Cl.$^7$ .......................................... H01L 21/8242
(52) U.S. Cl. ...................................... 438/250; 438/240
(58) Field of Search ................................ 438/238–240, 438/250–256, 381, 393–399, 3

(56) References Cited

U.S. PATENT DOCUMENTS

| | | |
|---|---|---|
| 4,471,405 A | 9/1984 | Howard et al. |
| 4,481,283 A | 11/1984 | Kerr et al. |
| 5,406,447 A | 4/1995 | Miyazaki |
| 5,479,316 A | 12/1995 | Smrtic et al. |
| 5,527,729 A * | 6/1996 | Matsumoto et al. |
| 5,644,158 A | 7/1997 | Fujii et al. |
| 5,874,770 A | 2/1999 | Saia et al. |
| 5,932,905 A | 8/1999 | O'Bryan, Jr. et al. |
| 5,977,582 A | 11/1999 | Fleming et al. |

FOREIGN PATENT DOCUMENTS

| | | |
|---|---|---|
| JP | 57-71162 | 5/1982 |
| JP | 3-257956 | 11/1991 |
| JP | 6-236963 | 8/1994 |

* cited by examiner

*Primary Examiner*—Jey Tsai
(74) *Attorney, Agent, or Firm*—McDermott, Will & Emery

(57) ABSTRACT

A semiconductor device including a capacitor element which has a high withstand voltage, a large capacitance, and little parasitic resistance and parasitic capacitance. On interlayer insulating films provided on a semiconductor device, there is formed a lower electrode of a capacitor element coated with an alumina thin film through use of a portion of a first metal layer to be used for forming a first wiring layer. An electrode to constitute a portion of an upper electrode of the capacitor element is formed from a second metal layer so as to come into contact with the alumina thin film provided on the surface of the lower electrode. On the electrode, an upper electrode of the capacitor element is formed through use of a portion of a third metal layer to be used for forming a second wiring layer. Further, an lead electrode connected to the lower electrode is formed through use of a portion of the third metal layer by removal of a portion of the alumina thin film provided on the surface of the lower electrode.

8 Claims, 15 Drawing Sheets

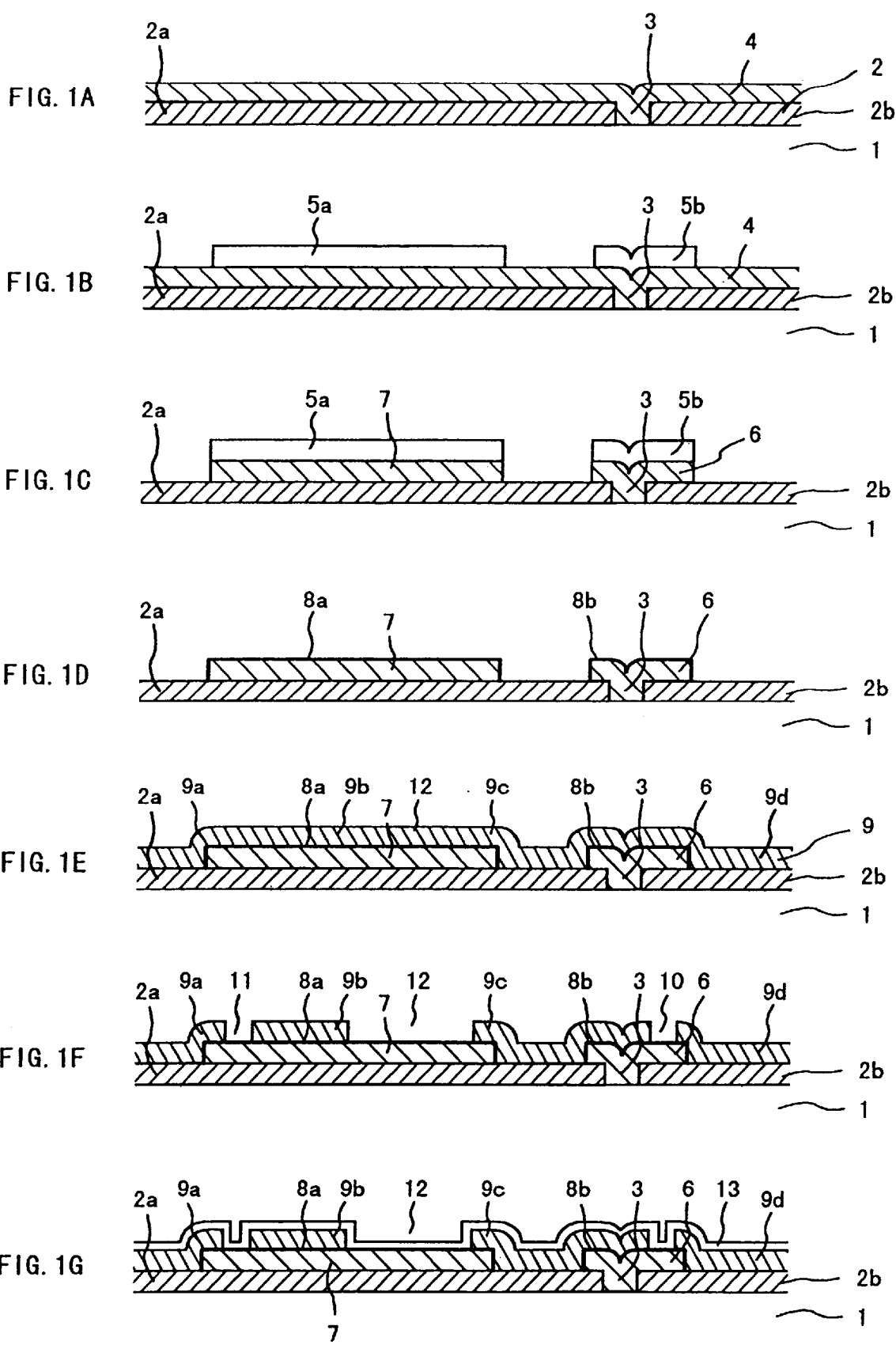

FIG. 3I    blank

FIG. 4I    blank

FIG. 4J    blank

FIG. 5I    blank

FIG. 5J    blank

FIG. 6G    blank

FIG. 6H    blank

FIG. 6I    blank

FIG. 7G    blank

FIG. 7H    blank

FIG. 7I    blank

FIG. 7J    blank

METHOD OF MANUFACTURING SEMICONDUCTOR DEVICE HAVING HIGH-DENSITY CAPACITOR ELEMENTS

This application is a divisional of Application Ser. No. 09/228,982, filed Jan. 12, 1999, U.S. Pat. No. 6,279,172.

BACKGROUND OF THE INVENTION

1. Field of the Invention

The present invention relates to a semiconductor device having a high-density, high-performance capacitor elements of large capacitance and high withstand voltage and which have little parasitic resistance and parasitic capacitance. The present invention also relates to a method of manufacturing the semiconductor device having such capacitor elements.

2. Background Art

A conventional method of manufacturing a semiconductor integrated circuit device having a built-in capacitor element will now be described.

FIG. 8 is a cross-sectional view showing one example of an conventional capacitor element formed in a semiconductor integrated circuit device.

In the drawing, reference numeral 1 designates a silicon substrate; 2c, 2d, and 2e designate interlayer insulating films; 3 designates a contact hole; 6 designates a first wiring layer; 12 designates a capacitor formation section; 17 designates an upper electrode of a capacitor element; 18 designates an interlayer insulating film; 19 designates a lower electrode of the capacitor element; and 20 designates an insulating film (i.e., a dielectric film) of the capacitor element.

In the example, an impurity-diffused layer, which is formed in the surface of the silicon substrate 1 simultaneously with formation of other circuit elements, is used as the lower electrode 19 of the capacitor element. As the upper electrode 17 of the capacitor element, a conductive film is used which is formed simultaneously with formation of a wiring layer, and is formed from a metal layer primarily constituted of aluminum or impurity-containing polysilicon. As an insulating film 20 interposed between the upper and lower electrodes 17, 19, a silicon oxide film or a silicon nitride film, which has a higher dielectric constant than the silicon oxide film, is used.

In a case where a metal layer, which is of the same metal layer as that used for the wiring layer, is used for the upper electrode 17, there are additionally required photolithography and etching processes for forming a hole in a capacitance formation area 12, aside from forming the other contact hole 3, in an interlayer insulating film between the lower surface of the metal layer and the silicon substrate 1.

In a case where a silicon nitride film is used as the insulating film 20 interposed between the upper and lower electrodes 17, 19, there are additionally required a process of depositing a nitride film by means of CVD, and photolithography and etching processes for patterning the deposited nitride film.

In a case where the silicon oxide film is used as the insulating film 20 interposed between the electrodes 17 and 19, the previously-described additional processes are unnecessary, although an oxidation process is required. However, the silicon oxide film is lower in dielectric constant than the silicon nitride film, and the area of the capacitance formation area 12 must be increased in order to ensure the same capacitance.

Alternatively, so long as the distance between the electrodes, i.e., the thickness of the insulating film 20 (a silicon oxide film), is reduced, the capacitance per unit area can be increased. However, this may results in a decrease in the withstand voltage of the capacitor element, which in turn causes an increase in leakage current.

Since an impurity-diffused layer is used for the lower electrode 19, parasitic capacitance between the silicon substrate 1 is added. Moreover, in case the impurity diffused layer works as an impurity-diffused layer for anther circuit element, the resistance can not be reduced. This results in addition of parasitic resistance to the capacitor element. To form an impurity-diffused layer designed specifically for use as a lower electrode of a capacitor element for the purpose of decreasing the resistance of the capacitor element, there are additionally required photolithography, etching, and impurity diffusion processes.

Even in a case where a conductive film, such as an impurity-containing polysilicon film, is used for the upper electrode 17, parasitic resistance poses a problem, as in the previous case. Unless the conductive film can work as a polysilicon film to be used for another circuit element, e.g., a gate electrode of MOS, there are additionally required a process of depositing a polysilicon film by means of CVD and photolithography, and etching processes for patterning the deposited polysilicon film, thus complicating the processes.

FIG. 9 is a cross-sectional view showing another example of an conventional capacitor element.

In the drawing, reference numeral 1 designates a silicon substrate; 6a and 6b designate wiring layers; 11 designates a hole for use in establishing connection with a lower electrode of the capacitor element; 12 designates a capacitance formation section; 18 designates a surface protective film; 21a designates a lower electrode of the capacitor element; 21b designates an upper electrode of the capacitor element; and 22a, 22b, 22c, and 22aa designate insulating films (i.e., silicon oxide films).

In this example, a capacitor element is formed on the interlayer insulating film 22a of the silicon substrate 1, on which other circuit elements are formed. Two-layer of impurity-containing polysilicon film are used as the upper and lower electrodes 21a, 21b of the capacitor element, and a silicon oxide film is used as the insulating film 22aa interposed between the electrodes 21a and 21b.

In this case, the parasitic capacitance between the lower electrode 21a and the silicon substrate 1 can be reduced. Since the impurity-containing polysilicon film is used for both the upper and lower electrodes 21a, 21b, parasitic resistance is added to the capacitor element, and manufacturing processes are complicated, as in the previously-cited case. Further, since the silicon oxide film is used as the insulating film 22aa interposed between the electrodes 21a and 21b, this conventional example also poses a problem, as in the previous case, in terms of capacitance, a withstand voltage, and a leakage current.

SUMMARY OF THE INVENTION

The present invention has been conceived to solve the problems of the conventional technique such as those mentioned above, and the object of the present invention is to provide a semiconductor device having a high-density, high-performance capacitor elements of large capacitance and high withstand voltage and which have little parasitic resistance and parasitic capacitance. The another object of the present invention is to provide a method of manufacturing the semiconductor device having such capacitor elements.

According to one aspect of the present invention, a semiconductor device comprises a semiconductor substrate and an interlayer insulating film provided on the semiconductor substrate. A first electrode is formed on the interlayer insulating film through use of a portion of a first metal layer, and serves as one of the electrodes of a capacitor. A metal oxide film is formed on the surface of the first electrode. A second electrode is formed on the metal oxide film and in contact with the metal oxide film, and is formed through use of a portion of a second metal layer, and serves as the other electrode of the capacitor. A third electrode is connected to the first electrode penetrating through the metal oxide film on the surface of the first electrode, and serves as a lead electrode of the first electrode.

In another aspect, a fourth electrode maybe formed on the second electrode and in contact with the second electrode. The third electrode and the fourth electrode may be formed through use of a third metal layer.

According to another aspect, the second electrode may be formed through use of a portion of a third metal layer, and the third electrode may be formed through use of a portion of a second metal layer.

According to another aspect, the second electrode and the third electrode may be formed through use of separate portions of the second metal layer.

The present invention also provide the methods of manufacturing semiconductor devices as depicted above.

Other and further objects, features and advantages of the invention will appear more fully from the following description.

BRIEF DESCRIPTION OF THE DRAWINGS

FIGS. 1A through 1M are cross-sectional views showing in sequential order a semiconductor manufacturing method according to a first embodiment of the present invention, and FIG. 1M shows a cross-sectional structure of the semiconductor device manufactured by the method.

FIG. 2M shows a cross-sectional structure of the semiconductor device manufactured by the method.

FIGS. 3A through 3M are cross-sectional views showing a semiconductor device manufacturing method according to a third embodiment of the present invention, and FIG. 3M shows a cross-sectional structure of the semiconductor device manufactured by the method.

FIGS. 4A through 4M are cross-sectional views showing a semiconductor device manufacturing method according to a fourth embodiment of the present invention, and FIG. 4M shows a cross-sectional structure of the semiconductor device manufactured by the method.

FIGS. 5A through 5M are cross-sectional views showing a semiconductor device manufacturing method according to a fifth embodiment of the present invention, and FIG. 5M shows a cross-sectional structure of the semiconductor device manufactured by the method.

FIGS. 6A through 6M are cross-sectional views showing a semiconductor device manufacturing method according to a sixth embodiment of the present invention, and FIG. 6M shows a cross-sectional structure of the semiconductor device manufactured by the method.

FIGS. 7A through 7M are cross-sectional views showing a semiconductor device manufacturing method according to a seventh embodiment of the present invention, and FIG. 7M shows a cross-sectional structure of the semiconductor device manufactured by the method.

DETAILED DESCRIPTION OF THE PREFERRED EMBODIMENTS

Figure 1H:
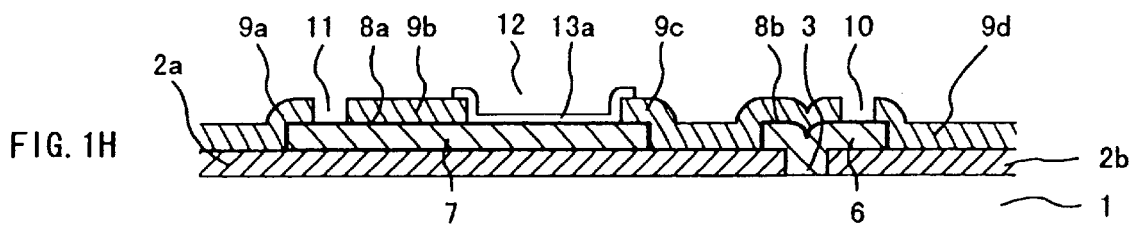

Preferred embodiments of the present invention will be described hereinbelow by reference to the accompanying drawings. Throughout the drawings, like reference numerals designate like or corresponding elements, and repetition of their explanations are simplified or omitted.

First Embodiment

FIGS. 1A through 1M are cross-sectional views showing in sequential order a semiconductor manufacturing method according to a first embodiment of the present invention.

As shown in FIG. 1A, a first interlayer insulating film 2 including portions 2a, 2b is formed from a silicon oxide film, or the like, on a silicon substrate (i.e., a semiconductor substrate) 1, on which other circuit elements are formed as required. After formation of a hole for connecting a wiring layer with the circuit element, i.e., a so-called contact hole 3, in the first interlayer insulating film 2a, 2b, a first metal layer 4 is formed simultaneous with formation of the wiring layer. The first metal layer 4 primarily comprises an aluminum film or aluminum, which is formed through use of, e.g., Al, AlSi, AlSiCu, or AlCu, by means of magnetron sputtering.

On the metal layer 4, there are formed photoresists 5a, 5b having patterns for forming a lower electrode of a capacitor element by means of photolithography.

As shown in FIG. 1C, a first wiring layer 6 and a lower electrode 7 of the capacitor element are formed by selectively etching unwanted portions of the first metal layer 4.

As shown in FIG. 1D, the photoresists 5a, 5b, whose purpose has been fulfilled, are removed by means of a plasma ashing system. At this time, the surface of the metal layer 4 primarily comprising an aluminum film or aluminum is oxidized to alumina thin films 8a, 8b (an $Al_2O_3$ thin film) (that is a metal oxide film).

As shown in FIG. 1E, a silicon oxide film or a silicon nitride film is deposited by means of plasma CVD, thus forming a second interlayer insulating film 9 including 9a, 9b, 9c, 9d.

As shown in FIG. 1F, an interlayer connection hole 10 for use in establishing connection with the first wiring layer 6, a hole 11 for use in establishing connection with the lower electrode 7 of the capacitor element, and a capacitance formation section 12 (i.e., a section to be used for forming an upper electrode of the capacitor element) are patterned by means of photolithography. These patterns are selectively etched so as to leave second interlayer insulating films 9a, 9b, 9c, and 9d, thus forming holes.

As shown in FIG. 1G, a second metal layer 13 is formed primarily from an aluminum film or aluminum so as to be thinner than the first metal layer 4.

Usually, immediately before sputtering of the second metal layer 13 (i.e., the second layer of metal), the wafer is continually subjected to sputter etching through use of the same sputtering system in order to eliminate the metal oxide film 8a (alumina in the case where the second metal layer comprises aluminum) from the surface of the lower electrode 7 (the first layer of metal) in the interlayer connection hole 12. However, in this case, the wafer is not subjected to sputter etching, thereby leaving alumina. Accordingly, the only requirement is that the second metal layer 13 has a thickness sufficient for protecting alumina from sputter etching at the time of formation of a third metal layer (which will be described later).

Next, as shown in FIG. 1H, a pattern for use as an upper electrode of the capacitor element is formed by means of photolithography, and undesired portions of the second metal layer 13 are selectively etched away, thereby forming an upper electrode lower layer 13a. At this time, since the second metal layer 13 is formed to be thin, there can be prevented over-etching of the metal layer in the interlayer connection hole 10 and the hole 11 (i.e., the first wiring layer 6 and the first electrode 7). The hole 11 is used for establishing a connection with the lower electrode 7 of the capacitor element.

Figure 1I:
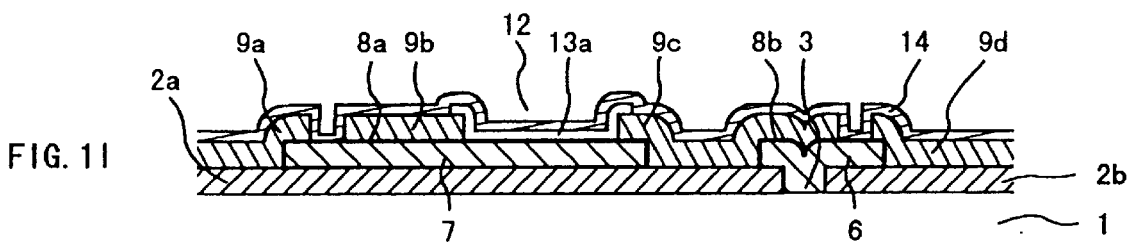

Next, as shown in FIG. 1I, a third interlayer insulating film 14 is formed from a silicon oxide film or a silicon nitride film and is deposited by means of plasma CVD so as to be thinner than the second interlayer insulating film 9. Here, the third interlayer insulating film is formed thinner in order to prevent an increase in level difference between the first wiring layer 6 and the interlayer connection hole 10, which would otherwise be increased during subsequent processes as a result of addition of the third interlayer insulating film 14.

Figure 1J:
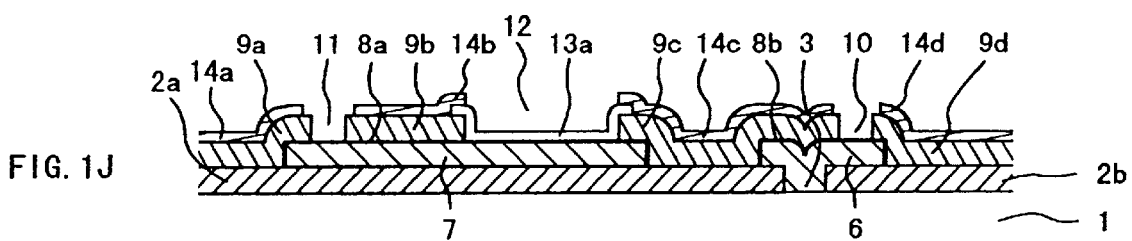

Next, as shown in FIG. 1J, the hole 10 for use in establishing connection with the first wiring layer 6, the hole 11 for use in establishing connection with the lower electrode 7 of the capacitor element, and the capacitance formation section 12 are patterned by means of photolithography. The patterns are selectively etched and opened so as to leave third interlayer insulating films 14a, 14b, 14c, and 14d. At this time, the portions of the holes 10 and 11 in the third interlayer insulating films 14 are formed by etching so as to be wider than the portions of the holes in the second interlayer insulating film 9.

Figure 1K:
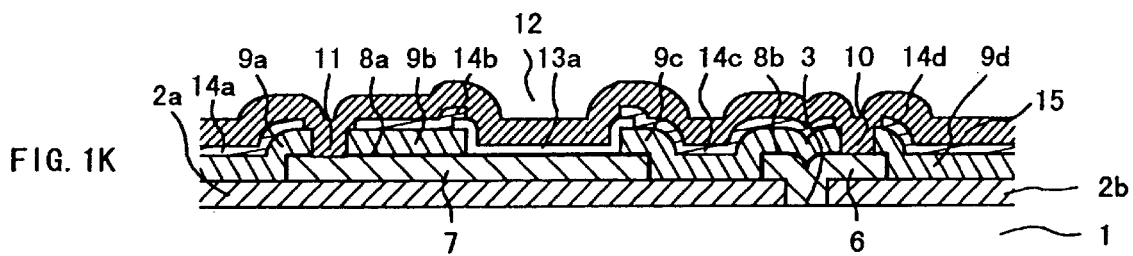

Next as shown in FIG. 1K, a third metal layer 15 is formed primarily from an aluminum film or aluminum, simultaneous with formation of the second wiring layer. In this example, the wafer is subjected to sputter etching immediately before sputtering of the metal layer 15, thus removing alumina, as in the usual case.

Figure 1L:
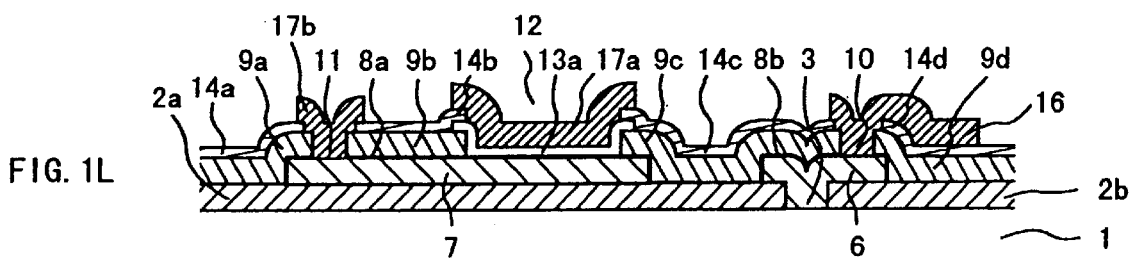

Next, as shown in FIG. 1L, a second wiring layer 16 and an upper electrode 17 of the capacitor element are patterned by means of photolithography by selectively etching away undesired portions of the third metal layer 15.

Figure 1M:
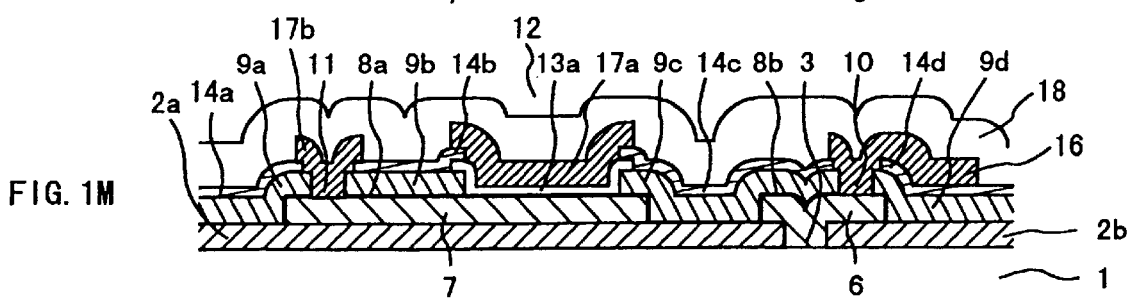

Next as shown in FIG. 1M, a silicon oxide film or a silicon nitride film is deposited by means of plasma CVD, thereby forming a surface protective film 18. As a result, preliminary-processes for the semiconductor device including a capacitor element are completed.

As mentioned above, according to the first embodiment, a metal layer, which is primarily formed from an aluminum film or a metal film mainly containing aluminum, and which is formed simultaneously with formation of a wiring layer of the semiconductor device, is used for the upper and lower electrodes 7, 17 of the capacitor element. The parasitic capacitance and parasitic resistance of the capacitor element are very small (equal to those of the wiring layer) and are negligible.

Since the alumina thin film 8a having a high dielectric constant is used as an insulating film (e.g., a dielectric film) between the upper and lower electrodes 7, 17, the alumina thin film can provide a greater withstand voltage and higher capacitance than those provided by a silicon oxide film or silicon nitride film. As a result, there can be formed a high-density high performance capacitor element whose capacitance formation section 12 is of smaller area.

Further, according to the first embodiment, as a result of the manufacturing processes shown in FIGS. 1G through 1J being added to the conventional processes for manufacturing a semiconductor integrated circuit device having double wiring layers, a semiconductor device having a built-in capacitor element which is superior in density and performance to a conventional capacitor element can be manufactured by addition of a small number of processes to the conventional manufacturing processes.

In the first embodiment, when the hole 10 for use in establishing connection with the first wiring layer 6, the hole 11 for use in establishing connection with the lower electrode 7 of the capacitor element, and the capacitance formation section 12 are patterned in the step shown in FIG. 1J by means of photolithography, a large dimensional margin should be ensured so as to allow the hole 10, the hole 11, and the capacitance formation section 12 to be overlaid on the holes formed in the second interlayer insulating films 9a, 9b, 9c, and 9d.

The structure of a semiconductor device which is shown in FIG. 1M and is manufactured in the first embodiment may be summarized as follows.

The semiconductor device according to the present embodiment comprises the lower electrode 7 (i.e., a first electrode serving as one of electrodes of a capacitor) of the capacitor element which is formed on the semiconductor substrate 1 from a portion of the first metal layer 4 and is coated with the metal oxide film 8a. An upper electrode lower layer (a second electrode serving as the other electrode of the capacitor) 13a of the capacitor element is formed from a portion of the second metal layer 13 so as to be in contact with at least the metal oxide film 8a of the lower electrode (i.e., the first electrode) 7. The lead electrode (i.e., the third electrode) 17b is connected to the lower electrode (i.e., the first electrode) 7 of the capacitor element by removing a portion of the metal oxide film 8a provided on the lower electrode (i.e., the first electrode) 7 of the capacitor element. The upper electrode (i.e., the fourth electrode) 17a of the capacitor element is formed from a portion of the third metal layer 15 so as to be in contact with the upper electrode lower layer (i.e., the second electrode) 13a of the capacitor element.

The previously-mentioned semiconductor device manufacturing method according to the first embodiment may be summarized as follows.

In the semiconductor device manufacturing method according to the first embodiment, the first interlayer insulating film 2a, 2b is formed on the semiconductor substrate 1, and the first metal layer 4 is formed on the first interlayer insulating film 2a, 2b. The first metal layer 4 is patterned to thereby form a first metal layer pattern including the lower electrode 7 of the capacitor element (i.e., the first electrode serving as one of the electrodes of a capacitor), and the metal oxide film 8a is formed on the surface of the first metal layer pattern.

Then, the second interlayer insulating film 9 is formed on the first metal layer pattern, and the first hole 12 is formed in the second interlayer insulating film 9 at the position where there is formed the upper electrode lower layer 13 of the capacitor element (i.e., the second electrode serving as the other electrode of the capacitor). Further, the second hole 11 is formed at the position where there is formed the lead electrode (i.e., the third electrode) 17b of the lower electrode 7 (i.e., the first electrode) of the capacitor element.

Then, the second metal layer 13 is formed on the second interlayer insulating film 9 and is patterned to thereby form a second metal layer pattern including the upper electrode lower layer 13a of the capacitor element (i.e., the second electrode serving as the other electrode of the capacitance) so as to oppose the lower electrode 7 of the capacitor element (i.e., the first electrode).

Then, the third interlayer insulating film 14 is formed on the second metal layer pattern, and the second hole 11 is formed in the third interlayer insulating film 14 in at least two positions, i.e., the position where the upper electrode lower layer 13a of the capacitor element (i.e., the second electrode) is located, and the position where the second hole 11 is formed.

Then, the third metal layer 15 is formed on the third interlayer insulating film 14 by removing the metal oxide film 5a which is provided on the surface of the lower electrode 7 (i.e., the first electrode) within the second hole 11. The thus-formed third metal layer 15 is patterned to thereby form a third metal layer pattern including the lead electrode 17b (i.e., the third electrode) connected to the lower electrode 7 (i.e., the first electrode) of the capacitor element and the upper electrode 17a (i.e., the fourth electrode) connected to the upper electrode lower layer 13a (i.e., the second electrode) of the capacitor element.

Second Embodiment

FIGS. 2A through 2M are cross-sectional views showing a semiconductor device manufacturing method according to a second embodiment of the present invention.

The processes shown in FIGS. 2A through 2E are identical with those shown in FIGS. 1A through 1E. On the first interlayer insulating film 2a, 2b provided on the silicon substrate 1, on which other circuit elements are formed as required, there is formed the lower electrode 7 of the capacitor element coated with the alumina thin film 8a, and the second interlayer insulating film 9 is formed on the lower electrode 7.

Figure 2A:
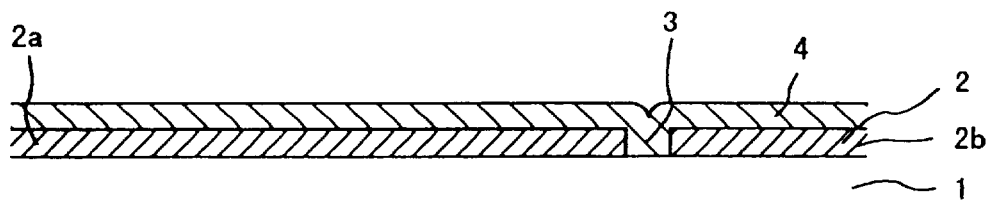
FIGS. 2A through 2M are cross-sectional views showing a semiconductor device manufacturing method according to a second embodiment of the present invention.
Figure 2B:
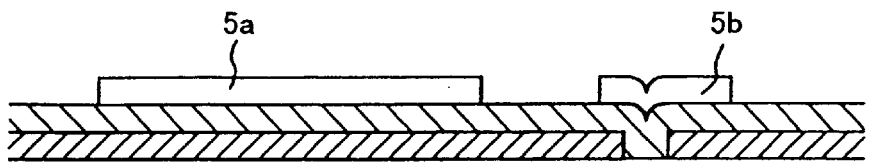
Figure 2C:
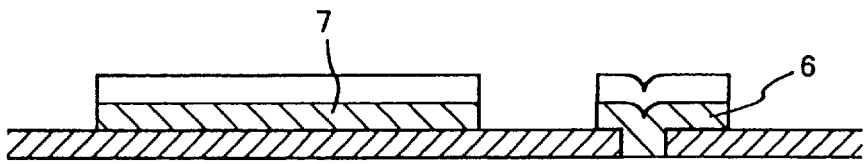
Figure 2D:
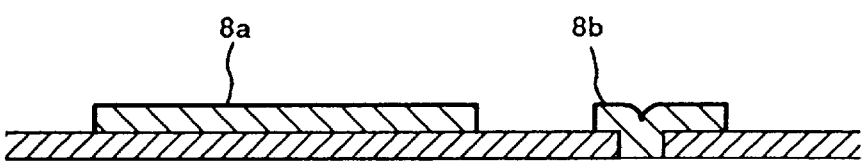
Figure 2E:
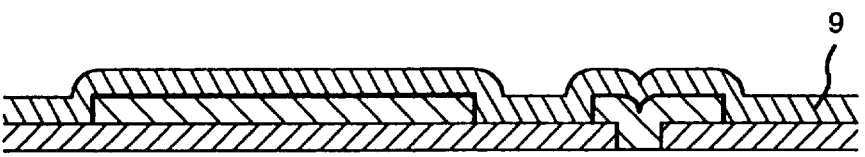
Figure 2F:
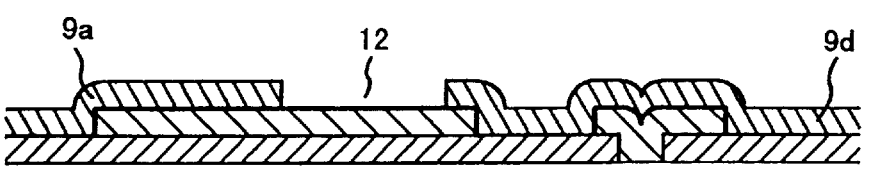

As shown in FIG. 2F, the capacitance formation section 12 (i.e., the upper electrode formation section of the capacitor) is patterned by means of photolithography and is formed by selective etching so as to leave the second interlayer insulating films 9a, 9d.

Figure 2G:
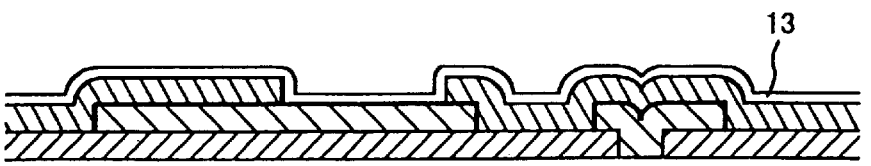

As shown in FIG. 2G, the second metal layer 13 is formed primarily from an aluminum film or metal film mainly containing aluminum so as to be thinner than the first metal layer 4. Here, in order to leave alumina, the second metal layer is not subjected to sputter etching.

Figure 2H:
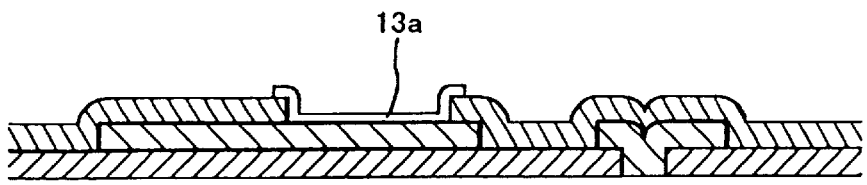

As shown in FIG. 2H, a pattern to be used for an upper electrode of the capacitor element is formed by means of photolithography, and undesired portions of the second metal layer 13 are selectively etched away, thus forming the upper electrode lower layer 13a.

Figure 2I:
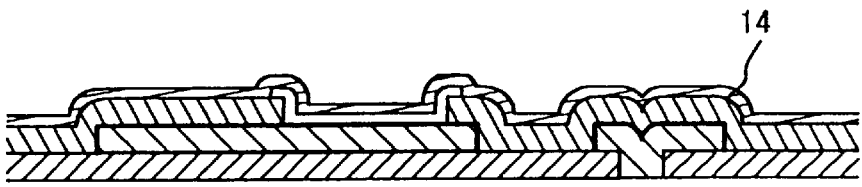

As shown in FIG. 2I, the third interlayer insulating film 14 is deposited so as to be thinner than the second interlayer insulating film 9.

Figure 2J:
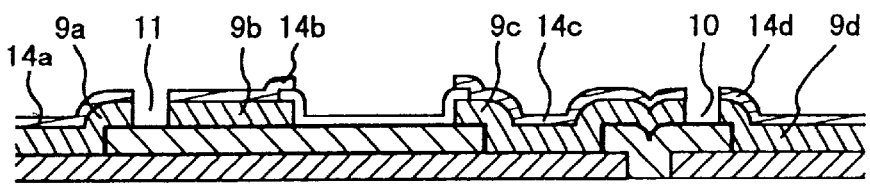

As shown in FIG. 2J, the hole 1Q for use in establishing connection with the first wiring layer 6 and the hole 11 for use in establishing connection with the lower electrode 7 of the capacitor element are patterned by means of photolithography by selectively etching away the second interlayer insulating film 9 and the third interlayer insulating film 14.

Concurrently, the capacitance formation section 12 is patterned by means of photolithography, and an opening is formed by selectively etching away the third interlayer insulating film 14.

As a result, there are left the second interlayer insulating films 9a, 9b, 9c, and 9d and the third interlayer insulating films 14a, 14b, 14c, and 14d.

Figure 2K:
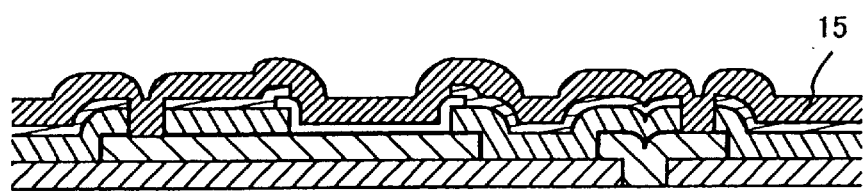

As shown in FIG. 2K, a third metal layer 15 is formed primarily from an aluminum film or metal film mainly containing aluminum. The third metal layer 15 is subjected to sputter etching, as is usually practiced, thus removing alumina.

Figure 2L:
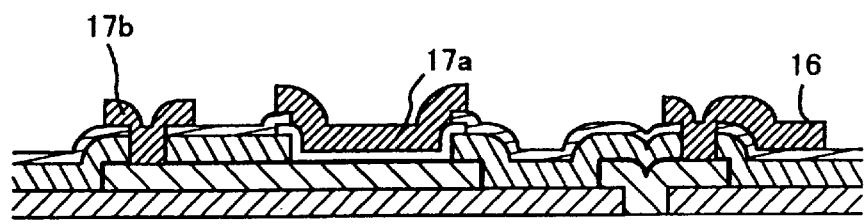
Figure 2M:
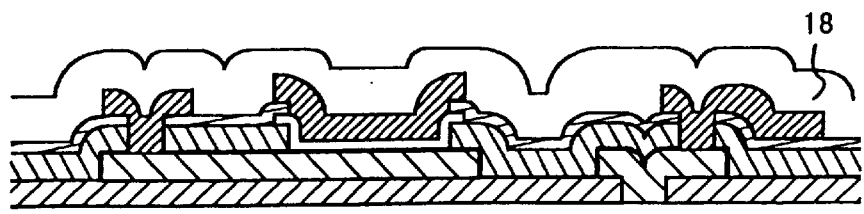

As shown in FIGS. 2L and 2M, the upper electrode 17a of the capacitor element and the lead electrode 17b or the lower electrode 7 are formed, and, further, the surface protective film 18 is formed. Preliminary processes for the semiconductor device including the capacitor element are now completed.

As mentioned previously, according to the second embodiment, a high-density, high-performance capacitor element having very little parasitic resistance and parasitic capacitance can be formed, as in the case of the first embodiment.

According to the second embodiment, as a result of the manufacturing processes shown in FIGS. 2F through 2J being added to the conventional processes of manufacturing a semiconductor integrated circuit device having a double wiring layer, a semiconductor device having a built-in capacitor element which is superior in density and performance to a conventional capacitor element can be manufactured by addition of a smaller number of processes to the conventional manufacturing processes.

Further, during the photolithography process there is no need to ensure a dimensional margin for overlaying purposes such as that required in the first embodiment.

In the second embodiment, simultaneously with etching of the second and third interlayer insulating films 9, 14 during the process shown in FIG. 2J, the capacitance formation section 12 is opened by etching solely the third thin interlayer insulating film 14. For this reason, there must be selected an etching method which prevents damage to the capacitance formation section 12.

The semiconductor device manufacturing method according to the second embodiment may be summarized as follows.

In the semiconductor device manufacturing method according to the second embodiment, the first interlayer insulating film 2a, 2b is formed on a semiconductor substrate 1, and a first metal layer 4 is formed on the first interlayer insulating films 2a, 2b. The first metal layer 4 is patterned to thereby form a first metal layer pattern including the lower electrode 7 of the capacitor element (i.e., the first electrode serving as one of the electrodes of a capacitor), and the metal oxide film 8a is formed on the surface of the first metal layer pattern.

Thereafter, the second interlayer insulating film 9 is formed on the first metal layer pattern, and the first hole 12 is formed in the second interlayer insulating film 9 at the position where there is formed the upper electrode lower layer 13a of the capacitor element (i.e., the second electrode serving as the other electrode of the capacitor).

Next, the second metal layer 13 is formed on the second interlayer insulating film 9 and is patterned to thereby form a second metal layer pattern including the upper electrode lower layer of the capacitor element (i.e., the second electrode serving as the other electrode of the capacitance) so as to oppose the lower electrode (i.e., the first electrode) 7 of the capacitor element.

The third interlayer insulating film 14 is formed on the second metal layer pattern, and holes are formed in the third interlayer insulating film 14 so as to be located on the upper electrode lower layer 13a (i.e., the second electrode). Further, the second hole 11 is formed in the third interlayer insulating film 14 and the second interlayer insulating film 9 at the position where there is formed the lead electrode 17b (i.e., the third electrode) of the upper electrode lower layer 13a (i.e., the second electrode) of the capacitor element.

The third metal layer 15 is formed on the third interlayer insulating film 14 by removing the metal oxide film 8a which is provided on the surface of the lower electrode 7 (i.e., the first electrode) within the second hole 11. The third metal layer 15 is patterned to thereby form a third metal layer pattern including the lead electrode 17b (i.e., the third electrode) connected to the lower electrode 7 (i.e., the first electrode) of the capacitor element and the upper electrode 17a (i.e., the fourth electrode) connected to the upper electrode lower layer 13a (i.e., the second electrode) of the capacitor element.

Third Embodiment

FIGS. 3A through 3M are cross-sectional views showing a semiconductor device manufacturing method according to a third embodiment of the present invention.

The processes shown in FIGS. 3A through 3E are identical with those shown in FIGS. 1A through 1E. On the first interlayer insulating film 2a, 2b provided on the silicon substrate 1, on which other circuit elements are formed as required, there is formed the lower electrode 7 of the capacitor element coated with the alumina thin film 8a, and the second interlayer insulating film 9 is formed on the lower electrode 7.

Figure 3A:
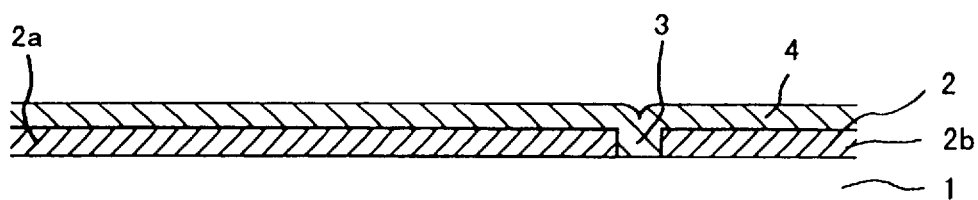
Figure 3B:
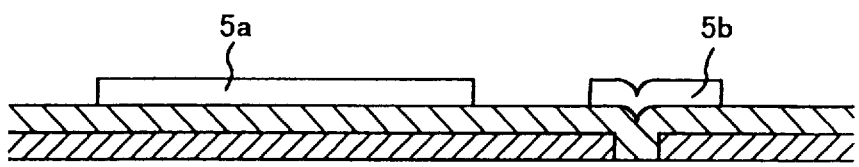
Figure 3C:
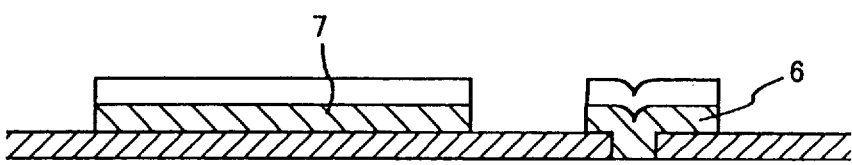
Figure 3D:
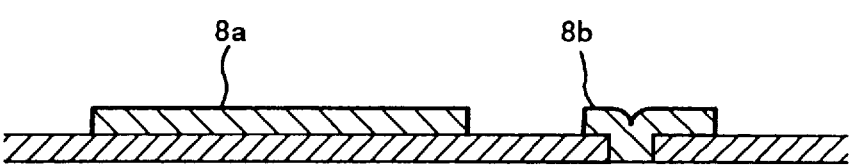
Figure 3E:
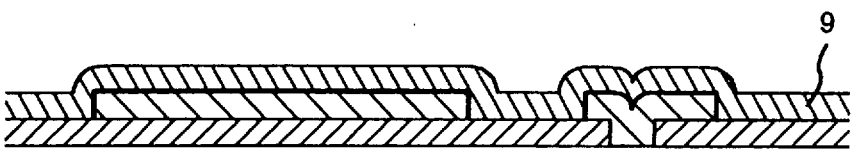
Figure 3F:
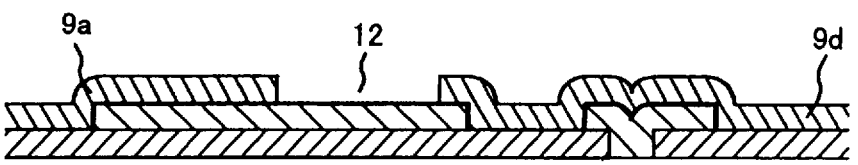

As shown in FIG. 3F, the capacitance formation section 12 is patterned by means of photolithography and is formed by selective etching so as to leave the second interlayer insulating films 9a, 9d.

Figure 3G:
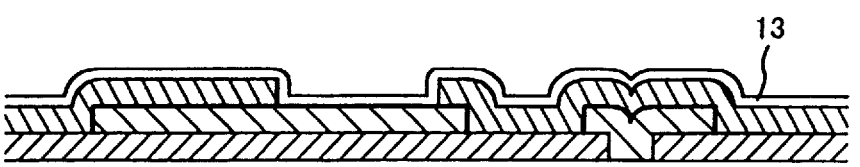

As shown in FIG. 3G, the second metal layer 13 is formed primarily from an aluminum film or metal film mainly containing aluminum so as to be thinner than the first metal layer 4. Here, in order to leave alumina the second metal layer is not subjected to sputter etching.

Figure 3H:
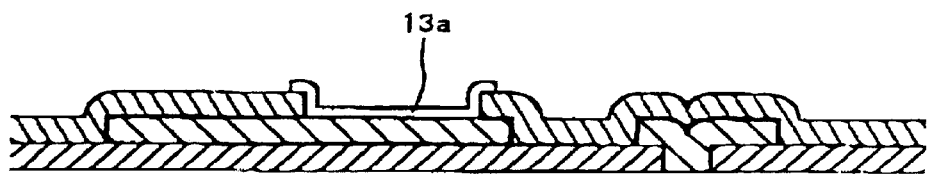

As shown in FIG. 3H, a pattern to be used for an upper electrode of the capacitor element is formed by means of photolithography, and undesired portions of the second metal layer 13 are selectively etched away, thus forming the upper electrode lower layer 13a.

As shown in FIG. 3I, there is no process corresponding to the step shown in FIG. 1I according to the first embodiment.

Figure 3J:
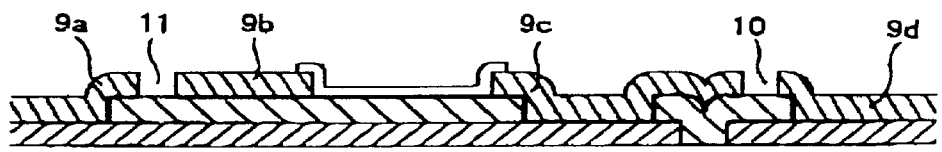

As shown in FIG. 3J, a hole 10 for use in establishing connection with the first wiring layer 6 and a hole 11 for use in establishing connection with the lower electrode 7 of the capacitor element are patterned by means of photolithography, and are formed by selective etching so as to leave the second interlayer insulating films 9a, 9b, 9c, and 9d.

Figure 3K:
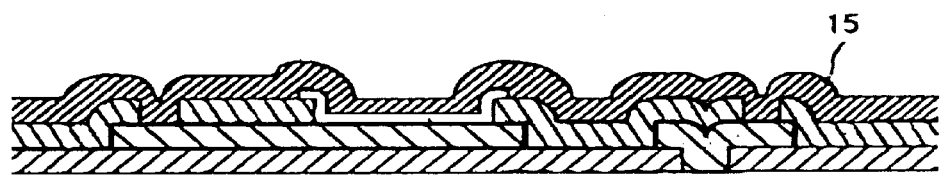

As shown in FIG. 3K, the third metal layer 15 is formed primarily from an aluminum film or metal film mainly containing aluminum. The third metal layer 15 is subjected to sputter etching, as is usually practiced, thus removing alumina.

Figure 3L:
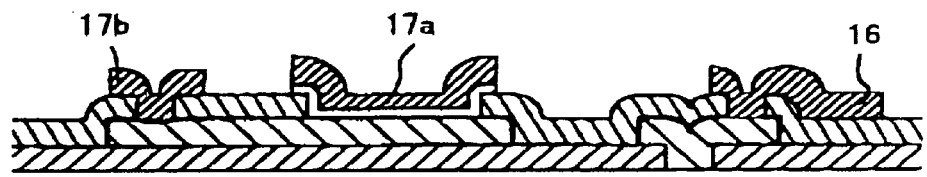
Figure 3M:
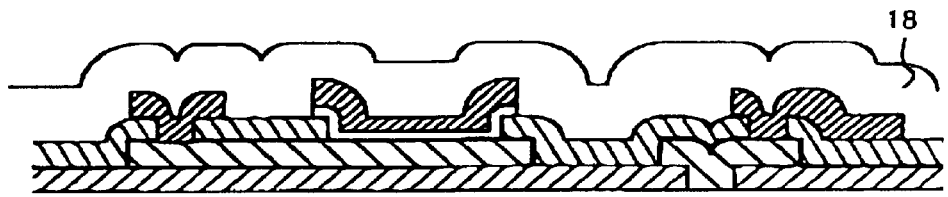

As shown in FIGS. 3L and 3M, the upper electrode 17a of the capacitor element and the lead electrode 17b of the lower electrode 7 are formed, and, further, the surface protective film 18 is formed. Preliminary processes for the semiconductor device including the capacitor element are now completed.

As mentioned previously, according to the third embodiment, a high-density, high-performance capacitor element having very little parasitic resistance and capacitance can be formed, as in the case of the first and second embodiments.

According to the third embodiment, as a result of the manufacturing processes shown in FIGS. 3F through 3H being added to the conventional processes of manufacturing a semiconductor integrated circuit device having a double wiring layers, a semiconductor device with a built-in capacitor element which is superior in density and performance to a conventional capacitor element can be manufactured by addition of a smaller number of processes to the conventional manufacturing processes as compared with the case of the first and second embodiments.

Further, during the photolithography process there is no need to ensure a dimensional margin for overlaying purposes such as that required in the first embodiment.

The semiconductor device manufacturing method according to the third embodiment may be summarized as follows.

In the semiconductor device manufacturing method according to the third embodiment, the first interlayer insulating film 2a, 2b is formed on the semiconductor substrate 1, and the first metal layer 4 is formed on the first interlayer insulating films 2a, 2b. The first metal layer 4 is patterned to thereby form the first metal layer pattern including the lower electrode 7 of the capacitor element (i.e., the first electrode serving as one of the electrodes of a capacitor), and the metal oxide film 8a is formed on the surface of the first metal layer pattern.

The second interlayer insulating film 9 is formed on the first metal layer pattern, and the first hole 12 is formed in the second interlayer insulating film 9 at the position where there is formed the upper electrode lower layer 13a of the capacitor element (i.e., the second electrode serving as the other electrode of the capacitor).

Next, the second metal layer 13 is formed on the second interlayer insulating film 9 and is patterned to thereby form the second metal layer pattern including the upper electrode lower layer of the capacitor element (i.e., the second electrode serving as the other electrode of the capacitance) so as to oppose the lower electrode 7 (i.e., the first electrode) of the capacitor element.

The second hole 11 is formed in the second interlayer insulating film 9 at the position where the lead electrode 17b (i.e., the third electrode) of the lower electrode 7 (i.e., the first electrode) of the capacitor element is formed.

The third metal layer 15 is formed on the second interlayer insulating film 9 by removal of the metal oxide film 8a which is provided on the surface of the lower electrode 7 (i.e., the first electrode) within the second hole 11. The third metal layer 15 is patterned to thereby form the third metal layer pattern including the lead electrode 17b (i.e., the third electrode) connected to the lower electrode 7 (i.e., the first electrode) of the capacitor element and the upper electrode 17a (i.e., the fourth electrode) connected to the upper electrode lower layer 13a (i.e., the second electrode) of the capacitor element.

Fourth Embodiment

FIGS. 4A through 4M are cross-sectional views showing a semiconductor device manufacturing method according to a fourth embodiment of the present invention.

The processes shown in FIGS. 4A through 4E are identical with those shown in FIGS. 1A through 1E. On the first interlayer insulating film 2a, 2b provided on the silicon substrate 1, on which other circuit elements are formed as required, there is formed the lower electrode 7 of the capacitor element coated with the alumina thin film 8a, and the second interlayer insulating film 9 is formed on the lower electrode 7.

Figure 4A:
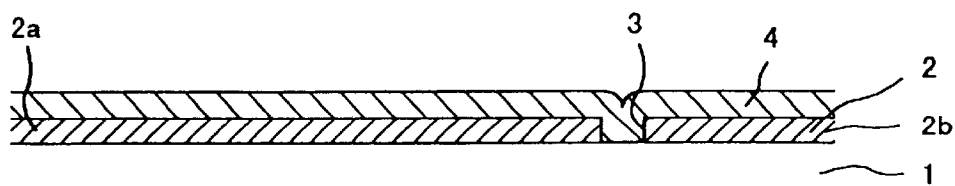
Figure 4B:
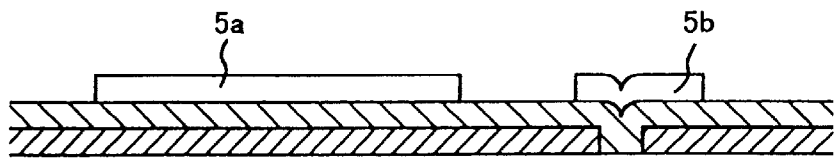
Figure 4C:
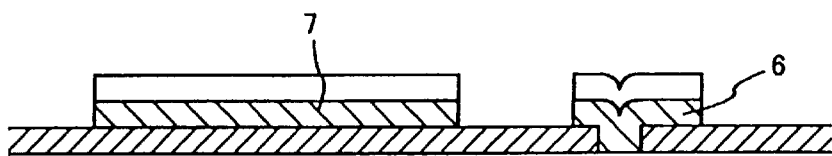
Figure 4D:
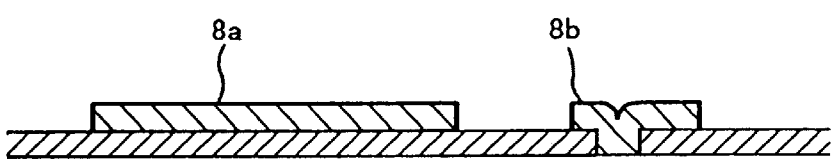
Figure 4E:
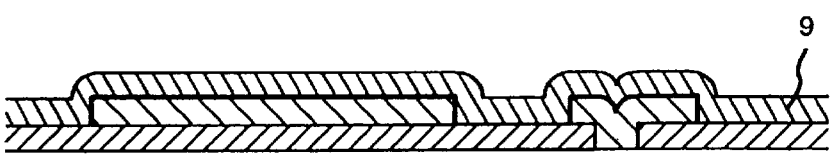
Figure 4F:
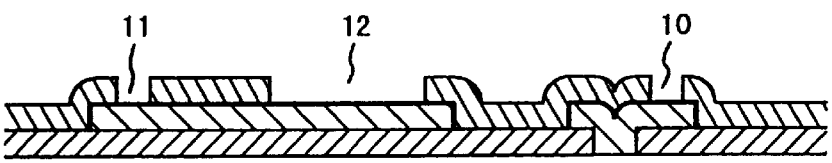

As shown in FIG. 4F, the hole 10 for use in establishing connection with the first wiring layer 6, the hole 11 for use in establishing connection with the lower electrode 7 of the capacitor element, and the capacitance formation section 12 are patterned by means of photolithography and are formed by selective etching so as to leave the second interlayer insulating films 9a, 9b, 9c, and 9d, as in the case of the process according to the first embodiment shown in FIG. 1F.

Figure 4G:
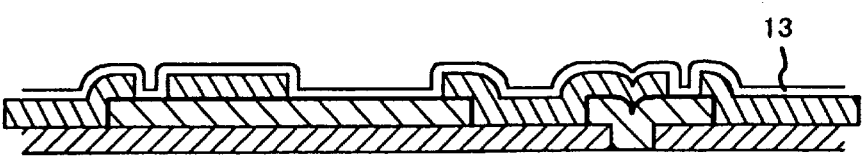

As shown in FIG. 4G, the second metal layer 13 is formed primarily from an aluminum film or metal film mainly containing aluminum so as to be thinner than the first metal layer 4. Here, in order to keep alumina, the second metal layer is not subjected to sputter etching, as in the case of the process according to the first embodiment shown in FIG. 1G.

Figure 4H:
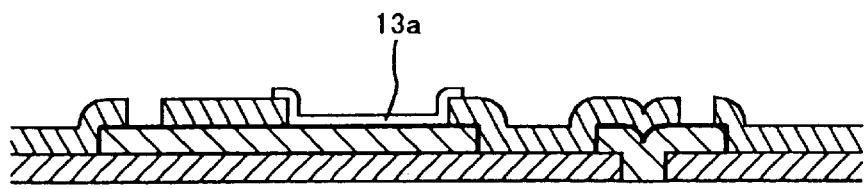

As shown in FIG. 4H, an upper electrode pattern for a capacitor element is formed by means of photolithography, and undesired portions of the second metal layer 13 are selectively etched away, thus forming the upper electrode lower layer 13a, as in the case of the process according to the first embodiment shown in FIG. 1H.

Since the second metal layer 13 is formed to be thin, over-etching of the hole 10 and the first metal layer 4 located within the hole 11 can be prevented.

As shown in blank FIGS. 4I and 4J, there are no processes corresponding to those shown in FIGS. 1I and 1J according to the first embodiment.

Figure 4K:
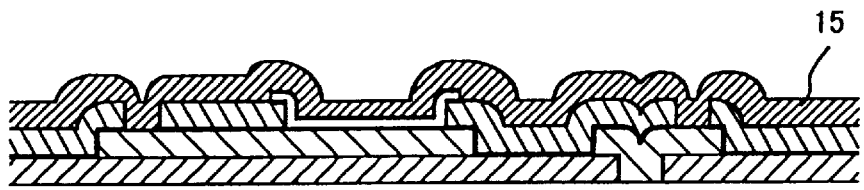

As shown in FIG. 4K, the third metal layer 15 is formed from an aluminum film or metal film mainly containing aluminum. The third metal layer 15 is subjected to sputter etching, as is usually practiced, thus removing alumina.

Figure 4L:
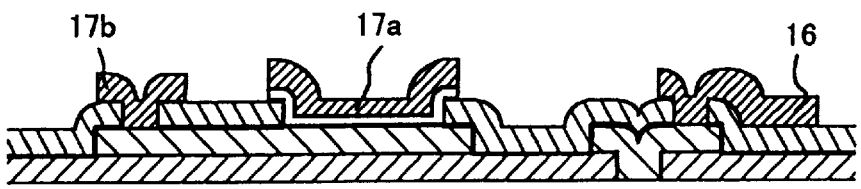
Figure 4M:
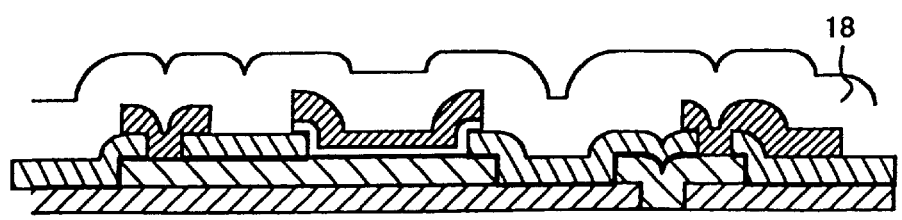

As shown in FIGS. 4L and 4M, the upper electrode 17a of the capacitor element and the lead electrode 17b of the lower electrode 7 are formed, and, further, the surface protective film 18 is formed. Preliminary processes for the semiconductor device including the capacitor element are now completed.

As mentioned above, according to the fourth embodiment, a high-density and high-performance capacitor element having very little parasitic resistance and parasitic capacitance can be formed, as in the case of the first, second, and third embodiments.

According to the fourth embodiment, as a result of the manufacturing processes shown in FIGS. 4G through 4H being added to the conventional processes of manufacturing a semiconductor integrated circuit device having a double wiring layer, a semiconductor device having a built-in capacitor element which is superior in density and performance to a conventional capacitor element can be manufactured by addition of a smaller number of processes to the conventional manufacturing processes as compared with the case of the first, second, and third embodiments.

Further, during the photolithography process there is no need to ensure a dimensional margin for overlaying purposes such as that required in the first embodiment.

The semiconductor device manufacturing method according to the fourth embodiment may be summarized as follows.

In the semiconductor device manufacturing method according to the fourth embodiment, the first interlayer insulating film 2a, 2b is formed on the semiconductor substrate 1, and the first metal layer 4 is formed on the first interlayer insulating films 2a, 2b. The first metal layer 4 is patterned to thereby form the first metal layer pattern including the lower electrode 7 of the capacitor element (i.e., the first electrode serving as one of the electrodes of a capacitor), and the metal oxide film 8a is formed on the surface of the first metal layer pattern.

The second interlayer insulating film 9 is formed on the first metal layer pattern, and the first hole 10 is formed in the second interlayer insulating film 9 at the position where there is formed the upper electrode lower layer 13a of the capacitor element (i.e., the second electrode serving as the other electrode of the capacitor). The second hole 11 is formed in the second interlayer insulating film 9 at the position where there is formed the lead electrode (i.e., the third electrode) of the lower electrode 7 (i.e., the first electrode) of the capacitor element.

Next, the second metal layer 13 is formed on the second interlayer insulating film 9 and is patterned to thereby form the second metal layer pattern including the upper electrode lower layer of the capacitor element (i.e., the second electrode serving as the other electrode of the capacitance) so as to oppose the lower electrode 7 of the capacitor element.

The third metal layer 15 is formed on the second interlayer insulating film 9 by removal of the metal oxide film 8a which is provided on the surface of the lower electrode 7 (i.e., the first electrode) within the second hole 11. The third metal layer 15 is patterned to thereby form the third metal layer pattern including the lead electrode 17b (i.e., the third electrode) connected to the lower electrode 7 (i.e., the first electrode) of the capacitor element and the upper electrode 17a (i.e., the fourth electrode) connected to the upper electrode lower layer 13a (i.e., the second electrode) of the capacitor element.

Fifth Embodiment

FIGS. 5A through 5M are cross-sectional views showing a semiconductor device manufacturing method according to a fifth embodiment of the present invention.

The processes shown in FIGS. 5A through 5E are identical with those shown in FIGS. 1A through 1E. On the first interlayer insulating film 2a, 2b provided on the silicon substrate 1, on which other circuit elements are formed as required, there is formed the lower electrode 7 of the capacitor element coated with the alumina thin film 8a, and the second interlayer insulating film 9 is formed on the lower electrode 7.

Figure 5A:
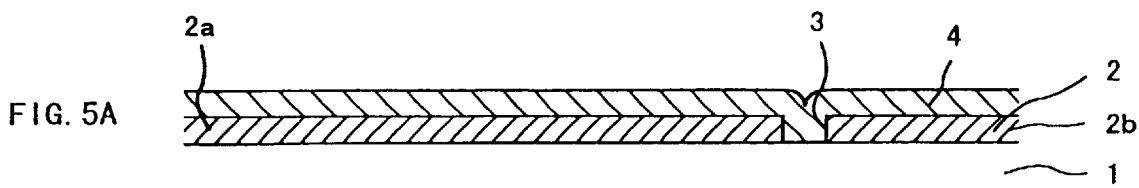
Figure 5B:
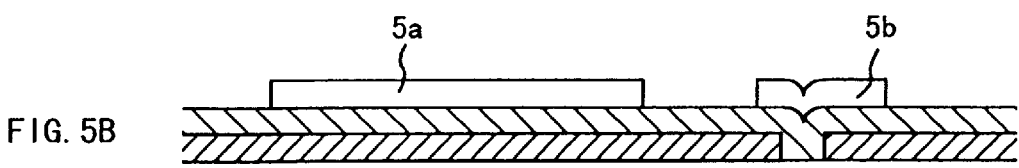
Figure 5C:
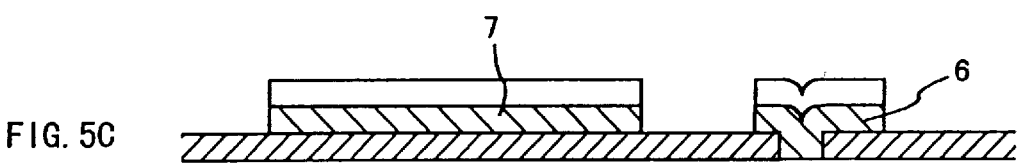
Figure 5D:
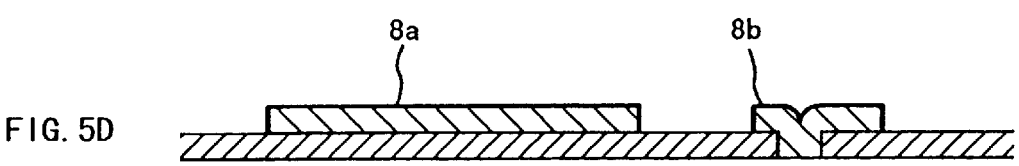
Figure 5E:
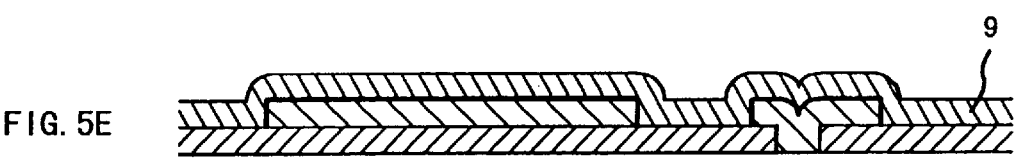
Figure 5F:
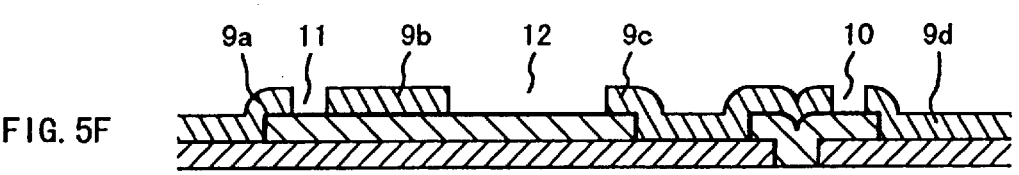

As shown in FIG. 5F, the hole 10 for use in establishing connection with the first wiring layer 6, the hole 11 for use in establishing connection with the lower electrode 7 of the capacitor element, and the capacitance formation section 12 are patterned by means of photolithography and are formed by selective etching so as to leave the second interlayer insulating films 9a, 9b, 9c, and 9d, as in the case of the process according to the first embodiment shown in FIG. 1F.

Figure 5G:
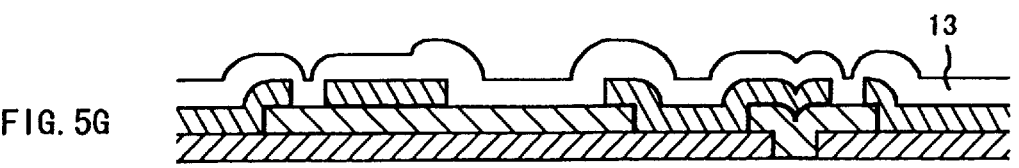

As shown in FIG. 5G, the second metal layer 13 is formed from an aluminum film or a metal film mainly containing aluminum simultaneously with formation of the second wiring layer. Here, in order to keep alumina, the second metal layer is not subjected to sputter etching.

Figure 5H:
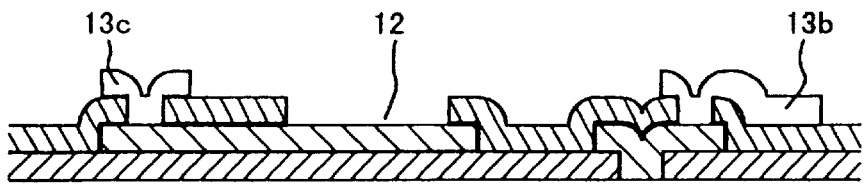

As shown in FIG. 5H, a second wiring layer 13b and an lead electrode 13c of the lower electrode 7 of the capacitor element are patterned by means of photolithography. Undesired portions of the second metal layer 13 are selectively etched away, thus causing the opening or hole of the capacitance formation section 12 to become exposed.

As shown in blank FIGS. 5I and 5J, there are no processes corresponding to those shown in FIGS. 1I and 1J according to the first embodiment.

Figure 5K:
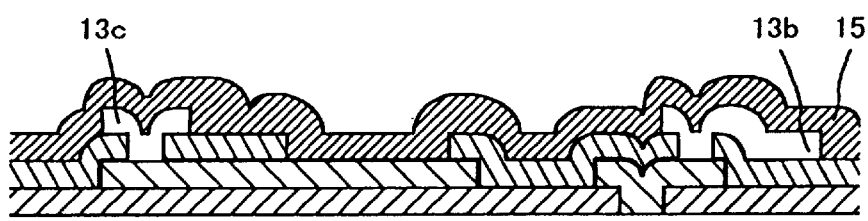

As shown in FIG. 5K, the metal oxide film 8a is again formed on the exposed surface of the lower electrode 7 of the capacitor element. The third metal layer 15 is formed from an aluminum film or a metal film mainly containing aluminum on the metal oxide film 5a. The lower electrode 7 is not subjected to sputter etching, thereby keeping alumina on the surface thereof.

Figure 5L:
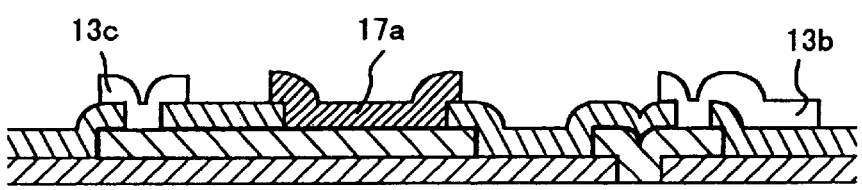

As shown in FIG. 5L, the upper electrode of the capacitor element is patterned by means of photolithography, and undesired portions of the third metal layer 15 are selectively etched away, thereby forming the upper electrode 17a of the capacitor element.

Figure 5M:
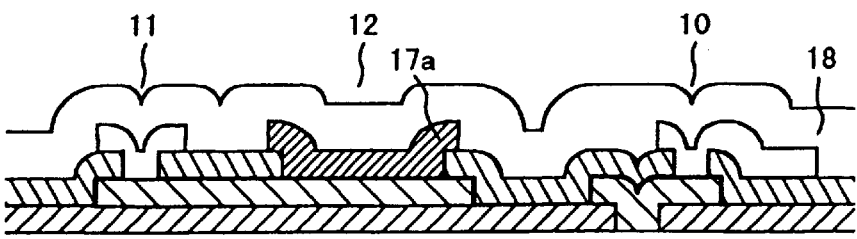

As shown in FIG. 5M, the surface protective film 18 is formed, thereby completing the preliminary processes for the semiconductor device including the capacitor element, as in the process according to the first embodiment shown in FIG. 1M.

As described above, according to the fifth embodiment, a high-density, high-performance capacitor element having very little parasitic resistance and parasitic capacitance can be formed, as in the case of the first, second, third, and fourth embodiments.

According to the fifth embodiment, as a result of the manufacturing processes shown in FIGS. 5K through 5L being added to the conventional processes of manufacturing a semiconductor integrated circuit device having a double wiring layers, a semiconductor device having a built-in capacitor element which is superior in density and performance to a conventional capacitor element can be manufactured by addition of a smaller number of processes to the conventional manufacturing processes as compared with the case of the first, second, and third embodiments.

Further, during the photolithography process there is no need to ensure a dimensional margin for overlaying purposes such as that required in the first embodiment.

In the present embodiment, when the second metal layer 13 shown in FIG. 5 is etched away, the surface of the first metal layer 4 (i.e., the lower electrode 7) is etched simultaneously. Further, when the third metal layer 15 shown in FIG. 5L is etched away, the surface of the second metal layer (i.e., the wiring 13b and the lead electrode 13c) is etched simultaneously. Therefore, conditions for respective etching must be optimized.

The configuration of the semiconductor device shown in FIG. 5M manufactured according to the fifth embodiment may be summarized as follows.

The semiconductor device according to the fifth embodiment comprises the lower electrode 7 of the capacitor element (i.e., a first electrode serving as one of electrodes of a capacitor) which is formed from a portion of the first metal layer 4 on the semiconductor substrate 1 and is coated with the metal oxide film 8a. An lead electrode (i.e., the third electrode) 13c is formed from a portion of the second metal layer 13 formed on the first metal layer 4 and is connected to the lower electrode 7 (i.e., the first electrode) of the capacitor element by removal of a portion of the metal oxide film 8a provided on the lower electrode 7 (i.e., the first electrode). The upper electrode 17a (i.e., the second electrode) of the capacitor element is formed from a portion of the third metal layer 15 so as to be in contact with the metal oxide film 8a provided on the lower electrode 7 (i.e., the first electrode) of the capacitor element.

The semiconductor device manufacturing method according to the fifth embodiment may be summarized as follows.

In the semiconductor device manufacturing method according to the fifth embodiment, the first interlayer insulating film 2a, 2b is formed on the semiconductor substrate 1, and the first metal layer 4 is formed on the first interlayer insulating film 2a, 2b. The first metal layer 4 is patterned to thereby form the first metal layer pattern including the lower electrode 7 of the capacitor element (i.e., the first electrode serving as one of the electrodes of a capacitor), and the metal oxide film 8a is formed on the surface of the first metal layer pattern.

The second interlayer insulating film 9 is formed on the first metal layer pattern, and the first hole 10 is formed in the second interlayer insulating film 9 at the position where there is formed the upper electrode lower layer of the capacitor element (i.e., the second electrode serving as the other electrode of the capacitor). The second hole 11 is formed in the second interlayer insulating film 9 at the position where there is formed the lead electrode (i.e., the third electrode) of the lower electrode 7 (i.e., the first electrode) of the capacitor element.

Next, the second metal layer 13 is formed on the second interlayer insulating film 9 by removal of the metal oxide film 8a provided on the surface of the lower electrode 7 (i.e., the first electrode) within the second hole 11 of the second interlayer insulating film 9. The thus-formed second metal layer 13 is patterned to thereby form the second metal layer pattern including the lead electrode 13c (i.e., the third electrode) connected to the lower electrode 7 (i.e., the first electrode) of the capacitor element.

The metal oxide film 8a is formed on the surface of the lower electrode 7 (i.e., the first electrode) of the capacitor element within the first hole 12 of the second interlayer insulating film 9, and the third metal layer 15 is formed over the metal oxide film 8a. The third metal layer 15 is patterned to thereby form a third metal layer pattern including an upper electrode 17a (i.e., the second electrode) of the capacitor element which opposes the lower electrode 7 (i.e., the first electrode) of the capacitor element and serves as the other electrode of the capacitor.

Sixth Embodiment

FIGS. 6A through 6M are cross-sectional views showing a semiconductor device manufacturing method according to a sixth embodiment of the present invention.

The processes shown in FIGS. 6A through 6E are identical with those shown in FIGS. 1A through 1E. On the first interlayer insulating film 2a, 2b provided on the silicon substrate 1, on which other circuit elements are formed as required, there is formed the lower electrode 7 of the capacitor element coated with the alumina thin film 8a, and the second interlayer insulating film 9 is formed on the lower electrode 7.

Figure 6A:
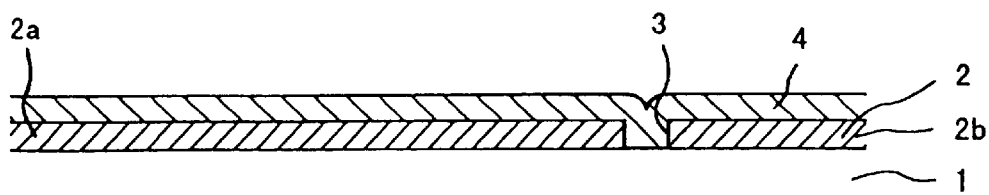
Figure 6B:
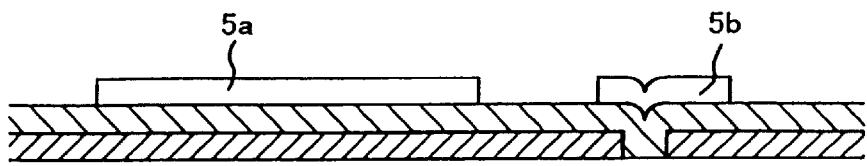
Figure 6C:
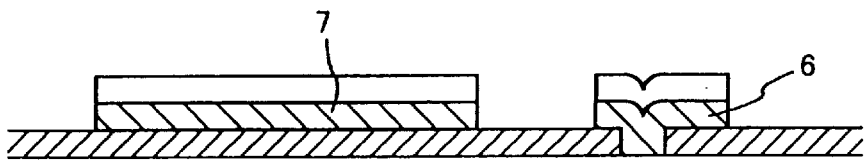
Figure 6D:
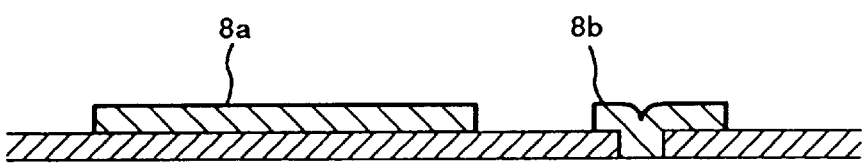
Figure 6E:
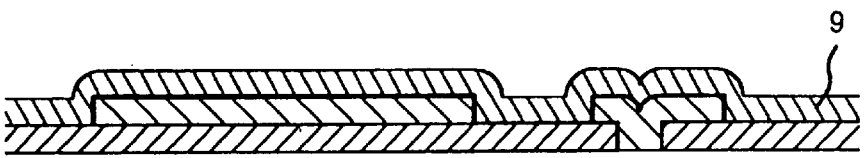
Figure 6F:
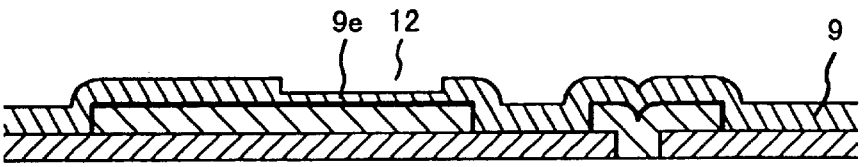

As shown in FIG. 6F, the capacitance formation section 12 is patterned by means of photolithography, and a hole is formed by selectively etching the second interlayer insulating film 9 to a certain depth, thereby leaving a thin portion of the second interlayer insulating film 9e on the bottom of the hole.

As shown in blank FIGS. 6G to 6I, there are no processes corresponding to those shown in FIGS. 1G to 1I according to the first embodiment.

Figure 6J:
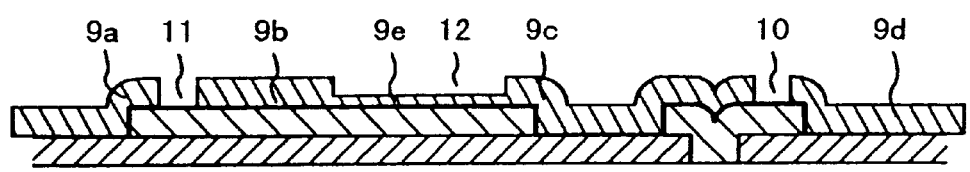

As shown in FIG. 6J, the hole 10 for use in establishing connection with the first wiring layer 6 and the hole 11 for use in establishing connection with the lower electrode 7 of the capacitor element are patterned by means of photolithography, and the holes are selectively etched so as to leave the second interlayer insulating films 9a, 9b, 9c, 9d, and 9e.

Figure 6K:
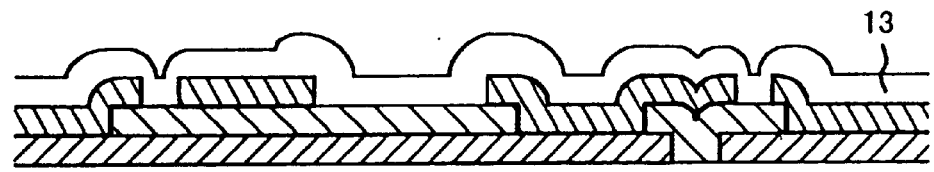

As shown in FIG. 6K, the second metal layer 13 is formed from an aluminum film or a metal film mainly containing aluminum. Here, the second metal layer is subjected to sputter etching, as is usually performed, thereby eliminating alumina on the surface thereof. Here, since a thin portion of the second interlayer insulating film 9e is left in the capacitance formation section 12, alumina is not eliminated but remains present.

Figure 6L:
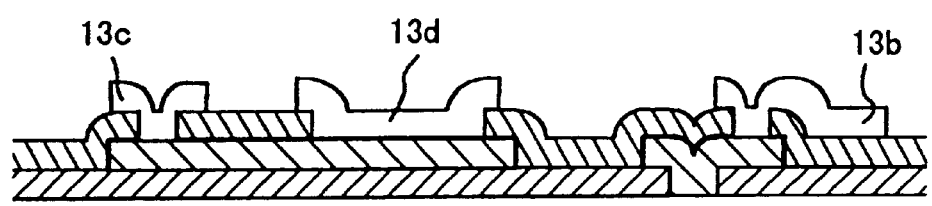

As shown in FIG. 6L, the second wiring layer 13b, the lead electrode 13c of the lower electrode 7 of the capacitor element, and an upper electrode 13d of the capacitor element are patterned by means of photolithography. Undesired portions of the second metal layer 13 are selectively etched away, thereby forming the upper electrode 13d of the capacitor element.

Figure 6M:
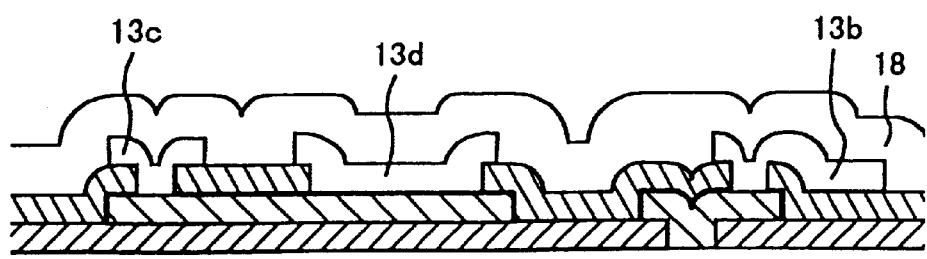

As shown in FIG. 6M, the surface protective film 18 is formed, thereby completing the preliminary processes for the semiconductor device including the capacitor element, as in the process according to the first embodiment shown in FIG. 1M.

As described above, according to the sixth embodiment, a high-density, high-performance capacitor element having very little parasitic resistance and parasitic capacitance can be formed, as in the case of the first, second, third, fourth, and fifth embodiments.

According to the sixth embodiment, as a result of the manufacturing process shown in FIG. 6F being added to the conventional processes of manufacturing a semiconductor integrated circuit device having double wiring layers, a semiconductor device having a built-in capacitor element which is superior in density and performance to a conventional capacitor element can be manufactured by addition of a smaller number of processes to the conventional manufacturing processes as compared with the case of the first through fifth embodiments. Consequently, according to the sixth embodiment, there is no need to add sputtering processes to the conventional method of manufacturing a semiconductor integrated circuit device.

Further, during the photolithography process there is no need to ensure a dimensional margin for overlaying purposes such as that required in the first embodiment.

On the other hand, the present embodiment requires control of thickness of the thin portion of the second interlayer insulating film 9e left on the bottom of the hole by etching the capacitance formation section 12 shown in FIG. 6F to a certain depth, as well as control of degree of sputter etching.

The configuration of the semiconductor device shown in FIG. 6M manufactured according to the sixth embodiment can be summarized as follows.

The semiconductor device according to the sixth embodiment comprises the lower electrode 7 of the capacitor element (i.e., a first electrode serving as one of electrodes of a capacitor) which is formed from a portion of the first metal layer 4 on the semiconductor substrate 1 and is coated with the metal oxide film 8a. At least the upper electrode 13d (i.e., the second electrode serving as the other electrode of the capacitor) is formed from a portion of the second metal layer 13 formed so as to be in contact with the metal oxide film 8a of the lower electrode 7 (i.e., the first electrode) of the capacitor element. The lead electrode 13c (i.e., the third electrode) is formed from another portion of the second metal layer 13 and is connected to the lower electrode 7 (i.e., the first electrode) of the capacitor element by removal of a portion of the metal oxide film 8a of the lower electrode 7 (i.e., the first electrode) of the capacitor element.

The semiconductor device manufacturing method according to the sixth embodiment may be summarized as follows.

In the semiconductor device manufacturing method according to the sixth embodiment, the first interlayer insulating film 2a, 2b is formed on the semiconductor substrate 1, and the first metal layer 4 is formed on the first interlayer insulating films 2a, 2b. The first metal layer 4 is patterned to thereby form the first metal layer pattern including the lower electrode 7 of the capacitor element (i.e., the first electrode serving as one of the electrodes of a capacitor), and the metal oxide film 8a is formed on the surface of the first metal layer pattern.

The second interlayer insulating film 9 is formed on the first metal layer pattern, and the first hole 10 is formed in the second interlayer insulating film 9 at least at the position where there is formed the upper electrode lower layer of the capacitor element (i.e., the second electrode serving as the other electrode of the capacitor), so as to keep the thin film 9e of the second interlayer insulating film 9 at the bottom of the hole 12.

The second hole 11 is formed in the second interlayer insulating film 9 at the position where there is formed the lead electrode (i.e., the third electrode) of the lower electrode 7 (i.e., the first electrode) of the capacitor element.

Next, the second metal layer 13 is formed on the second interlayer insulating film 9 by removal of the thin film 9e of the interlayer insulating film from the bottom of the first hole 12, as well as by removal of the metal oxide film 8a from the surface of the lower electrode 7 (i.e., the first electrode) of the capacitor element within the second hole 11. The thus-formed second metal layer 13 is patterned to thereby form the second metal layer pattern including the upper electrode 13d of the capacitor element (i.e., the second electrode serving as the other electrode of the capacitor) facing the lower electrode 7 (i.e., the first electrode) of the capacitor element, and the lead electrode 13c (i.e., the third electrode) connected to the first electrode.

Seventh Embodiment

FIGS. 7A through 7M are cross-sectional views showing a semiconductor device manufacturing method according to a seventh embodiment of the present invention.

The processes shown in FIGS. 7A through 7D are identical with those shown in FIGS. 1A through 1D. On the first interlayer insulating film 2a, 2b provided on the silicon substrate 1, on which other circuit elements are formed as required, there is formed the lower electrode 7 of the capacitor element coated with the alumina thin film 8a, and the second interlayer insulating film 9 is formed on the lower electrode 7.

Figure 7A:
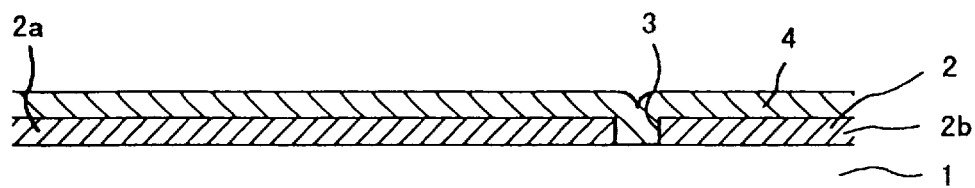
Figure 7B:
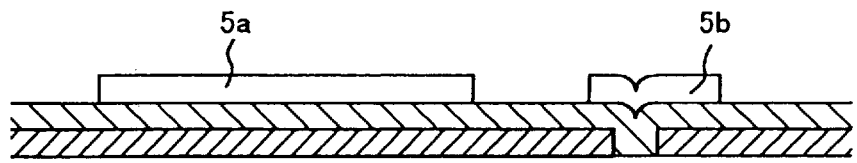
Figure 7C:
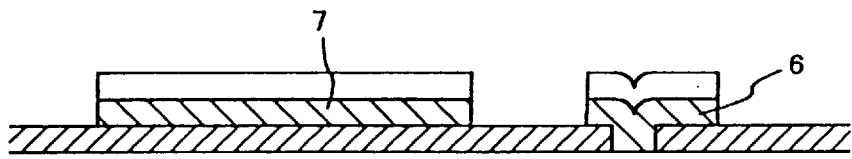
Figure 7D:
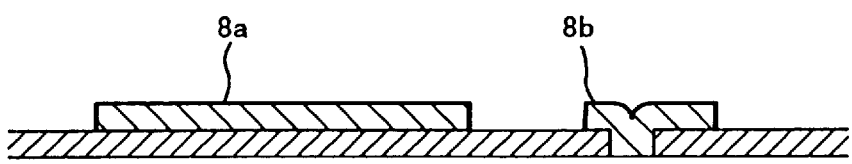
Figures 1, 7D:
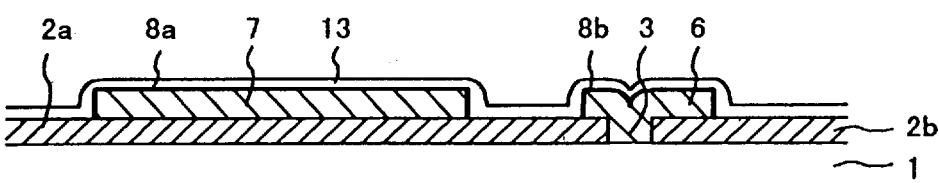
Figures 2, 7D:
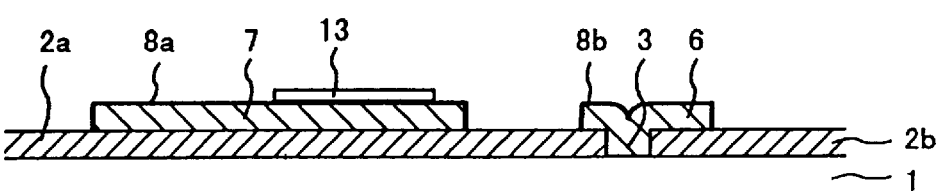

As show in FIGS. 7D-1 and 7D-2, the manufacturing step shown in FIG. 7D is followed by manufacturing processes analogous to those shown in FIGS. 1G through 1H according to the first embodiment.

More specifically, as shown in FIG. 7D-1, the second metal layer 13 is formed from an aluminum film or a metal film mainly containing aluminum so as to become thinner than the first metal layer 4, as in the case in the manufacturing process shown in FIG. 1G. Here, the lower electrode 7 is not subjected to sputter etching, thereby keeping alumina on the surface thereof.

As shown in FIG. 7D-2, a pattern for use as an upper electrode of a capacitor element is patterned by means of photolithography, and undesired portions of the second metal layer 13 are selectively etched away, as in the process according to the first embodiment shown in FIG. 1H.

Since the second metal layer 13 is formed to be thin, over-etching of the first metal layer 4 can be prevented. However, in contrast with only the connection holes 10, 11 being etched in the first embodiment, in the seventh embodiment in addition to the connection holes being etched, the entire first metal layer 4 (i.e., the wiring layer 6 and the lower electrode 7) is slightly etched.

Figure 7E:
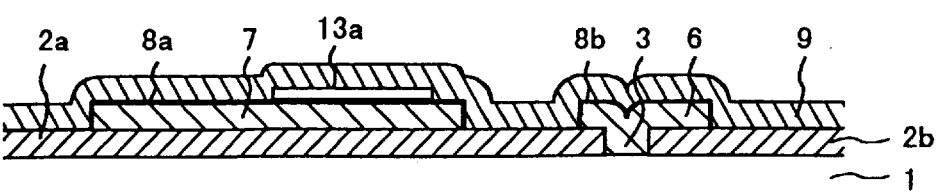

As shown in FIG. 7E, the second interlayer insulating film 9 is formed.

Figure 7F:
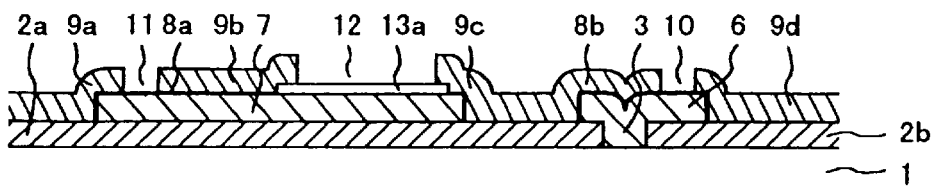

As shown in FIG. 7F, the hole 10 for use in establishing connection with the first wiring layer 6, the hole 11 for use in establishing connection with the lower electrode 7 of the capacitor element, and the capacitance formation section 12 are patterned by means of photolithography, and the holes are formed by selective etching so as to leave the second interlayer insulating films 9a, 9b, 9c, and 9d.

As shown in blank FIGS. 7G to 7J, there are no processes corresponding to those shown in FIGS. 1G to 1J according to the first embodiment.

Figure 7K:
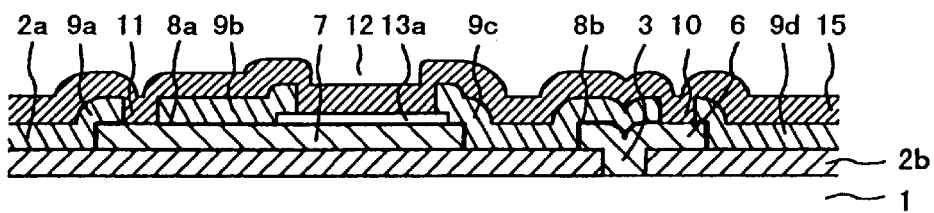

As shown in FIG. 7K, the third metal layer 15 is primarily formed from an aluminum film or aluminum. As is usually practiced, the metal layer is subjected to sputter etching, thus eliminating alumina.

Figure 7L:
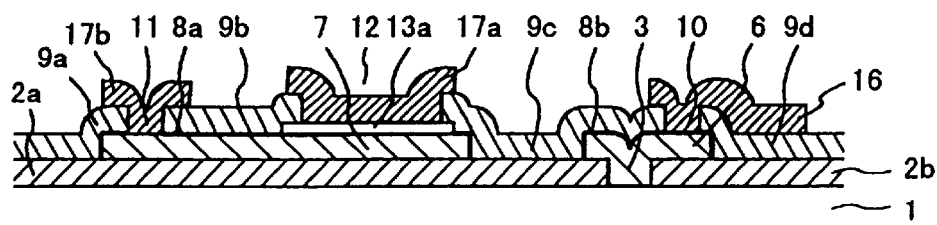
Figure 7M:
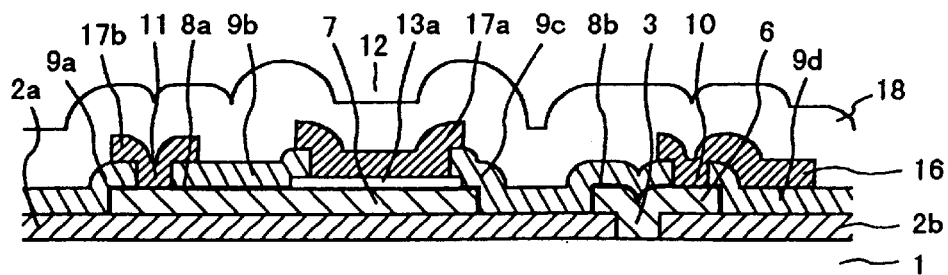
Figure 8:
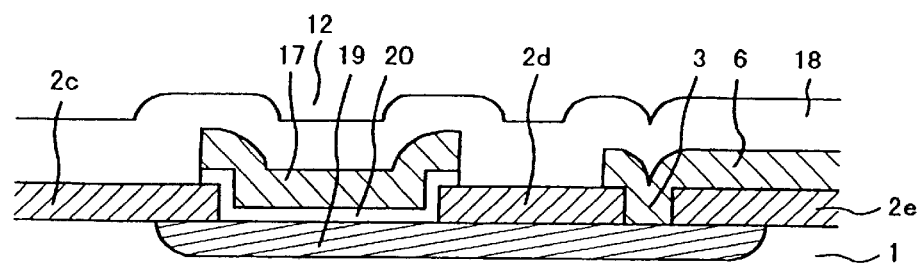
FIG. 8 is a cross-sectional view showing one example of an conventional capacitor element formed in a semiconductor integrated circuit device.
Figure 9:
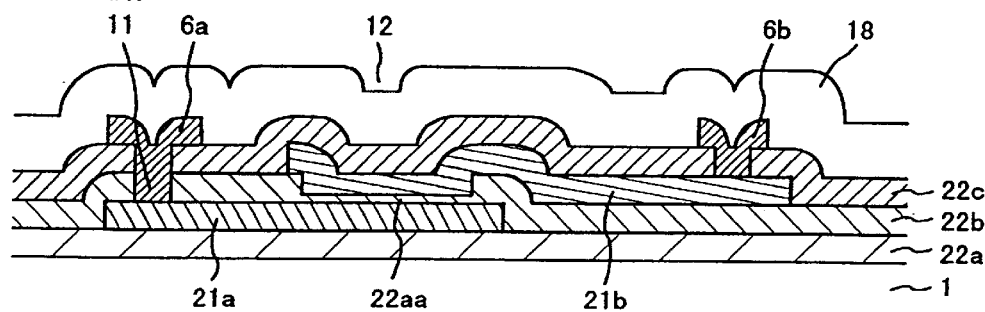
FIG. 9 is a cross-sectional view showing another example of an conventional capacitor element formed in a semiconductor integrated circuit device.

As shown in FIGS. 7L and 7, the upper electrode 17a of the capacitor element and an lead electrode 17b of the lower electrode 7 are formed. Further, the surface protective film 18 is formed, thereby completing the preliminary processes for the semiconductor device including the capacitor element.

As described above, according to the seventh embodiment, a high-density, high-performance capacitor element having very little parasitic resistance and parasitic capacitance can be formed, as in the case of the first through sixth embodiments.

According to the seventh embodiment, as a result of the manufacturing process shown in FIG. 7D-1 and 7D-2 being added to the conventional processes of manufacturing a semiconductor integrated circuit device having double wiring layers, a semiconductor device having a built-in capacitor element which is superior in density and performance to a conventional capacitor element can be manufactured by addition of a smaller number of processes to the conventional manufacturing processes as compared with the case of the first through third embodiments.

Further, during the photolithography process there is no need to ensure a dimensional margin for overlaying purposes such as that required in the first embodiment.

The semiconductor device manufacturing method according to the seventh embodiment may be summarized as follows.

In the semiconductor device manufacturing method according to the seventh embodiment, the first interlayer insulating film 2a, 2b is formed on the semiconductor substrate 1, and the first metal layer 4 is formed on the first interlayer insulating film 2a, 2b. The first metal layer 4 is patterned to thereby form the first metal layer pattern including the lower electrode 7 of the capacitor element (i.e., the first electrode serving as one of the electrodes of a capacitor), and the metal oxide film 8a is formed on the surface of the first metal layer pattern.

The second metal layer 13 is formed on the first metal layer and is patterned to thereby form a second metal layer pattern including the upper electrode lower layer 13a (i.e., the second electrode serving as the other electrode of the capacitor) so as to face the lower electrode 7 (i.e., the first electrode) of the capacitor element.

The second interlayer insulating film 9 is formed on the first metal layer pattern and the second metal layer pattern, and the first hole 12 is formed in the second interlayer insulating film 9 at the position where there is formed the upper electrode lower layer 13a of the capacitor element (i.e., the second electrode serving as the other electrode of the capacitor). Further, the second hole 11 is formed in the second interlayer insulating film 9 at the position where there is formed the lead electrode (i.e., the third electrode) of the lower electrode 7 (i.e., the first electrode) of the capacitor element.

Next, the second metal layer 13 is formed on the second interlayer insulating film 9 by removal of the metal oxide film 8a from the surface of the lower electrode 7 (i.e., the first electrode) of the capacitor element within the second hole 11. The thus-formed second metal layer 13 is patterned to thereby form a third metal layer pattern including the lead electrode 17b (i.e., the third electrode) of the capacitor element and the upper electrode 17a (i.e., the fourth electrode) connected to the upper electrode lower layer 13a (i.e., the second electrode) of the capacitor element.

The effects and advantages of the present invention may be summarized as follows.

As has been described above, in the present invention, a metal oxide film having a high dielectric constant, particularly an alumina film, is used as an insulating film interposed between upper and lower electrodes of a capacitor element of a semiconductor device. Therefore, as compared with a silicon oxide film or a silicon nitride film, the insulating film enables formation of a high-density, high-performance capacitor element which has a high withstand voltage and a large capacitance and requires a small area for a capacitance formation section.

Further, the present invention enables formation of a semiconductor device including a high-density, high-performance capacitor element which has little parasitic resistance and parasitic capacitance, a high withstand voltage, and a large capacitance.

Further, the present invention enables manufacture of a semiconductor device having a built-in capacitor element which is superior in density and performance to a conventional semiconductor device, by addition of a small number of manufacturing processes to a conventional method of manufacturing a semiconductor integrated circuit device having double or two-tire wiring layers.

Obviously many modifications and variations of the present invention are possible in the light of the above teachings. It is therefore to be understood that within the scope of the appended claims the invention may by practiced otherwise than as specifically described.

What is claimed is:

1. A method of manufacturing a semiconductor device comprising the steps of:

forming a first interlayer insulating film on a semiconductor substrate;

forming a first electrode on said first interlayer insulating film to serve as one of the electrodes of a capacitor;

forming a metal oxide film on the top surface of said first electrode;

forming a second interlayer insulating film on said first electrode;

forming an opening in said second interlayer insulating film and forming a second electrode in said opening in contact with said metal oxide film to serve as other electrode of said capacitor;

forming another opening in said second interlayer insulating film and forming a third electrode in contact with said first electrode penetrating through said metal oxide film to serve as a lead electrode to said first electrode.

2. The semiconductor device manufacturing method according to claim 1, wherein said first electrode is formed from a first metal layer, and said second electrode is formed from a second metal layer, and said third electrode is formed from a third metal layer.

3. The method of manufacturing a semiconductor device according to claim 1, further comprising the step of:

forming a fourth electrode on said second electrode in contact with said second electrode.

4. The semiconductor device manufacturing method according to claim 2, wherein said first electrode is formed from a first metal layer, and said second electrode is formed from a second metal layer, and said third electrode and said fourth electrode are formed from a third metal layer.

5. The semiconductor device manufacturing method according to claim 1, wherein said first electrode is formed from a first metal layer, and said third electrode is formed from a second metal layer, and said second electrode is formed from a third metal layer.

6. The semiconductor device manufacturing method according to claim 1, wherein said first electrode is formed from a first metal layer, and said second electrode and said third electrode are formed from a second metal layer.

7. The semiconductor device manufacturing method according to claim 1, wherein said first electrode is formed of an aluminum layer, and said metal oxide film is formed of an alumina thin film.

8. The semiconductor device manufacturing method according to claim 1, wherein said metal oxide film is formed through oxygen plasma simultaneously with ashing of a resist pattern.

* * * * *